United States Patent
Mills et al.

(10) Patent No.: US 9,257,836 B2
(45) Date of Patent: Feb. 9, 2016

(54) SUPPRESSION OF TRANSIENTS IN COMMUNICATIONS ACROSS AN ISOLATION BARRIER

(71) Applicant: Silicon Laboratories Inc., Austin, TX (US)

(72) Inventors: Michael J. Mills, Austin, TX (US);
Timothy J. Dupuis, Austin, TX (US);
Riad Wahby, Austin, TX (US);
Siddharth Sundar, Austin, TX (US);
Jeffrey L. Sonntag, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 14/143,504

(22) Filed: Dec. 30, 2013

(65) Prior Publication Data

US 2015/0180228 A1 Jun. 25, 2015

Related U.S. Application Data

(60) Provisional application No. 61/918,416, filed on Dec. 19, 2013.

(51) Int. Cl.
*H02H 9/04* (2006.01)
*H01F 19/04* (2006.01)

(52) U.S. Cl.
CPC . *H02H 9/04* (2013.01); *H01F 19/04* (2013.01)

(58) Field of Classification Search
CPC ...... H01F 19/04; H01F 2019/085; H02H 9/04
See application file for complete search history.

(56) References Cited

U.S. PATENT DOCUMENTS

| | | | |
|---|---|---|---|
| 7,016,204 B2 * | 3/2006 | Yang et al. | 363/21.13 |
| 7,667,500 B1 * | 2/2010 | Alfke | 327/34 |
| 7,719,305 B2 * | 5/2010 | Chen | 326/21 |
| 8,385,043 B2 * | 2/2013 | Ng et al. | 361/268 |

* cited by examiner

*Primary Examiner* — Zeev V Kitov

(74) *Attorney, Agent, or Firm* — Abel Law Group, LLP

(57) ABSTRACT

Common mode transient immunity for an isolation system is improved by using a common transient suppression circuit coupled to a receive circuit to suppress transients in signals received by the receive circuit that were transmitted from a transmit side of the isolation barrier using optical, magnetic, inductive, or other mechanisms.

19 Claims, 4 Drawing Sheets

SUPPRESSION OF TRANSIENTS IN COMMUNICATIONS ACROSS AN ISOLATION BARRIER

CROSS-REFERENCE TO RELATED APPLICATIONS

This application claims benefit under 35 U.S.C. §119(e) of U.S. Provisional Application No. 61/918,416 filed Dec. 19, 2013, which application is incorporated herein by reference.

BACKGROUND

1. Field of the Invention

This application relates to isolation barriers and more particularly to suppressing common mode transients in communications across isolation barriers.

2. Description of the Related Art

Isolation barriers can be found in many applications such as voltage converters. Isolation barrier refers to an electrical isolation between two domains. Such isolation may be needed because during normal operation a large DC or transient voltage difference exists between the domains. For example, one domain may be "grounded" at a voltage which is switching with respect to earth ground by hundreds or thousands of volts. Another reason for such isolation is based on safety, even when the expected voltage difference between the domains is small in normal operation. An example of this would be in biomedical applications, where electrodes are taped to a patient's body, safety concerns demand an extra layer of protection between the patient and the ground of the measurement device, despite the fact that the measurement device is supposed to be properly grounded.

Isolation barriers typically consist of layers of dielectrics with good breakdown properties. Communication across isolation barriers is commonly done using optical (opto-isolators), inductive (transformer) solutions, or using capacitive isolation circuitry to transmit information across isolation barriers. However, such communication is susceptible to common mode transients that can interfere with the accuracy of the information transmitted across the channel.

Thus, it would be desirable to provide isolation technology with greater immunity to common mode transients.

SUMMARY OF EMBODIMENTS OF THE INVENTION

Accordingly, in one embodiment an apparatus includes a receive circuit to receive signals from an isolation communication channel used to communicate across an isolation bather and to provide a receive circuit output signal. A common mode transient suppression circuit is coupled to the receive circuit to suppress transients in the receive circuit output signal.

In another embodiment, a method includes receiving a signal transmitted to communicate across an isolation barrier; and suppressing transients in the received signal having an event length less than a predetermined length of time.

In another embodiment, an isolation apparatus includes a transmit circuit coupled on a transmit side of an isolation barrier to receive an input signal and to supply a signal to be communicated to a receive circuit on a receive side of the isolation barrier. The isolation apparatus further includes the receive circuit to receive the signal on a receive side of the isolation barrier and a common mode transient suppression circuit coupled to the receive circuit to suppress transients in the signal received by the receive circuit if the transients have an event length less than a predetermined amount of time.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
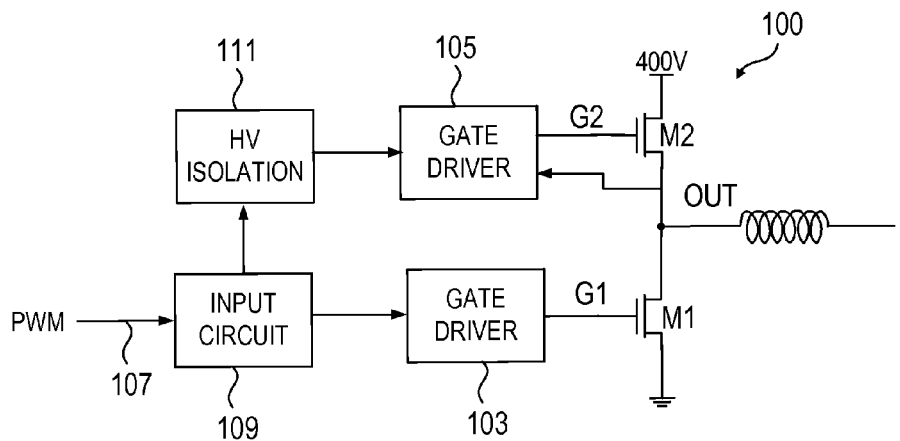
FIG. 1 illustrates a gate driver circuit with an isolation barrier.

In isolated gate driver circuits for switching power supplies there is a need for circuits that have high common mode transient immunity (CMTI). Logic high/low CMTI is the maximum tolerable change in common mode voltage over time to ensure that the output remains in a valid high/low state. In the past, CMTI levels of 25-50 kV/μs have been adequate, but with emerging new power FET technologies, levels up to 200 kV/μs may be required. In a switching power supply common mode transients may show up as a transient in the gate driver when the high common mode event occurs. That problem is illustrated with reference to FIGS. 1 to 3. Referring to FIG. 1, a switching power supply system 100 is illustrated. In the system 100, the power MOM-ET transistors M1 and M2 are on at different times. The node OUT switches between 400V and 0V according to the pulse width modulation (PWM) signal 107. The gate driver 103 drives M1 with gate control signal G1 and the gate driver 105 drives M2 with gate control signal G2. To turn on M2, the gate voltage G2 is driven to a voltage of OUT+10V to OUT+30V. To turn on M1, the gate voltage G1 is driven to a voltage usually between 10V and 30V. The gate driver 105 is isolated from the input PWM signal with high voltage isolation barrier 111.

Figure 2:
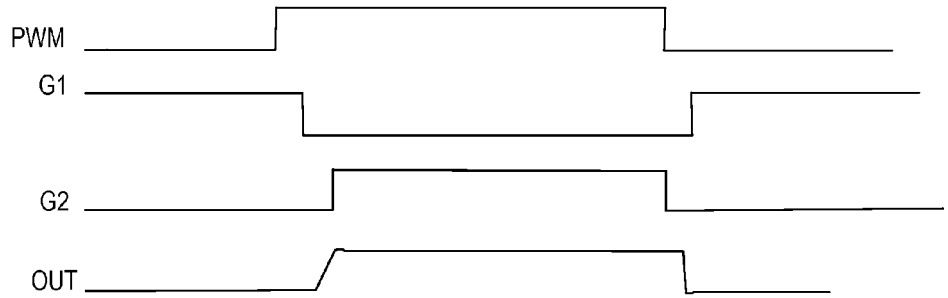
FIG. 2 illustrates a timing diagram associated with the gate driver circuit of FIG. 1.

The high voltage isolation technology could be of various types such as opto-isolators, transformers, capacitive isolation, or high voltage transistors. Each of these isolation technologies have limitations when extremely fast common mode transients are applied and can produce undesirable transients on the output. FIG. 2 illustrates a conventional timing diagram associated with the circuit of FIG. 1. The PWM signal 107 is supplied to the input circuit 109, which supplies the control signals to the gate driver 103 and through the high voltage isolation barrier 111 to the gate driver 105. Note that OUT transitions slightly after G1 goes low but before G2 goes high. Note also that for the falling edge OUT transitions slightly after G2 goes low and before G1 goes high. OUT transitions during the time G1 and G2 are both low.

Figure 3:
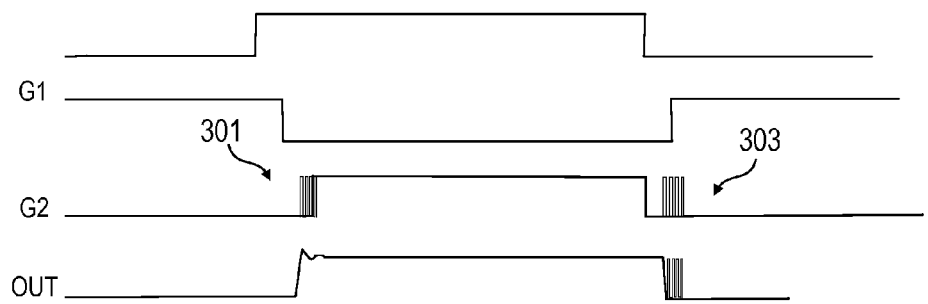
FIG. 3 illustrates a timing diagram of transients that may be associated with the gate driver circuit of FIG. 1.

FIG. 3 illustrates one example of distortions in the output signal that can be caused by common mode transients associated with high voltage isolation barriers. The transients 301 may cause the gate drive signal G2 to be distorted, which causes inaccuracy with respect to the input PWM waveform. The transients 303 may cause M2 to be on at the same time as M1, which can damage the power transistors and also lower efficiency of the voltage conversion. The transients appear slightly after the OUT transition and stop shortly after OUT transitions. Other combination of events can also result in undesirable transients in the output signal.

Figure 4:
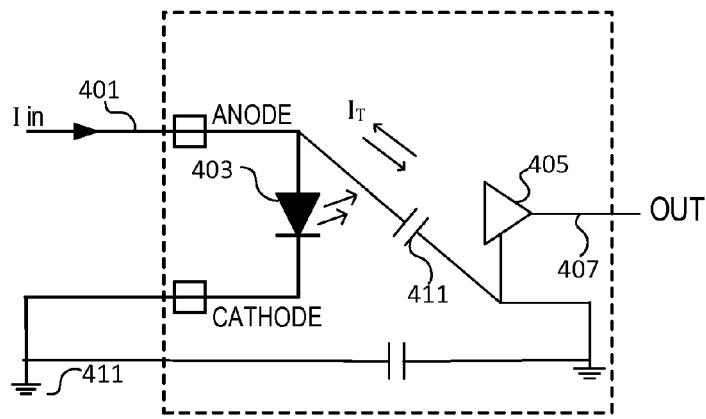
FIG. 4 illustrates an opto-isolator and sources of transients that may be associated therewith.

FIG. 4 illustrates an embodiment where opto-isolators may be used to provide isolation between the control signal and the drivers and how common mode transients may arise in such circuits. When a current on node 401 is applied to light emitting diode (LED) 403, the diode emits light which is received by photo transistor 405. The output of the photo transistor may be used to drive a driver or supply some other circuit. The transient current $I_T$, which charges or discharges capacitance 411, may cause the input current to be too low to drive the LED 403 or may cause the LED 403 to turn on when not desired if the transient current is sufficiently strong. Thus, the common mode transient can cause the signal 407 on the receive side to differ from the input signal $I_{IN}$ supplied on node 401. One solution to common mode transients in opto-isolators is to overdrive the LED 403 to keep it on when a common mode transient occurs during an output high state and to take excess transient current to ground during an output low state. That may require an external switch, which could add cost and system complexity.

Figure 5:
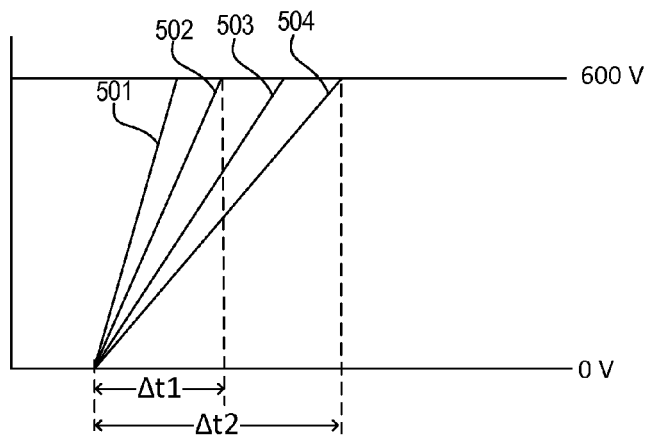
FIG. 5 illustrates timing that may be associated with transient events.

FIG. 5 illustrates timing considerations of common mode transient events. Assume that the working voltage of the isolation technology is between 0V and 600V, then the transients are also between 0V and 600V. FIG. 5 illustrates four events 501, 502, 503, and 504. The length of the event is determined by the slope, i.e., how long the transient takes to go between 0V and 600V. Note that while positive going transients are shown, negative going transients with a negative slope may also be present. The length $\Delta t1$ is associated with transient event 502 and $\Delta t2$ is associated with transient event 504. The length of the transient event can matter as the isolation channels may be natively immune to transient events greater than a certain length. For example, in the opto-system of FIG. 4, if the change in voltage is sufficiently slow (low slope), then the extra current $I_T$ may not affect the diode. The current $I_T$ is a function of the capacitance and the rate of change of voltage $$\left(C\frac{dv}{dt}\right)$$

and if the rate of voltage change is sufficiently slow the current $I_T$ may be insufficient to turn off the diode given a sufficiently high drive current and will be insufficient to turn on the diode if $I_T$ is less than the threshold current to turn on the diode. Other isolation technologies may also be immune to transient event lengths longer than a particular time threshold.

Figure 6:
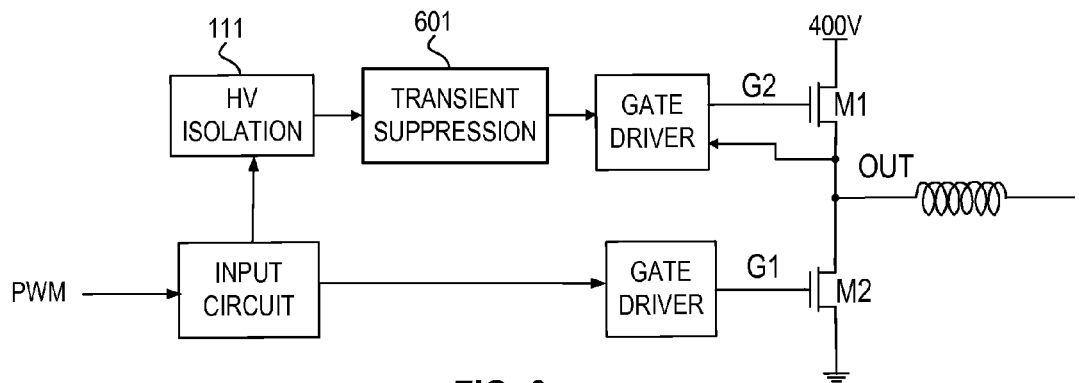
FIG. 6 illustrates an exemplary embodiment of a gate driver circuit with a transient suppression circuit.

Referring to FIG. 6, one embodiment utilizes a transient suppression circuit 601 to provide increased CMTI for a gate driver circuit for a switching power supply. The transient suppression circuit 601 suppresses transients having an event time less than a predetermined length. Thus, if an isolation technology is natively immune to transients above a particular threshold length, e.g., $\Delta t2$ for event 504 in FIG. 5, the transient suppression circuit can be designed to suppress transients below that particular threshold length. In that way, the suppression circuit suppresses transients of a duration corresponding to the threshold length and below to ensure that those transients do not cause the output of the isolation system to be different from the input to the isolation system. Transients with an event length longer than the threshold time may be ignored.

Figure 7:
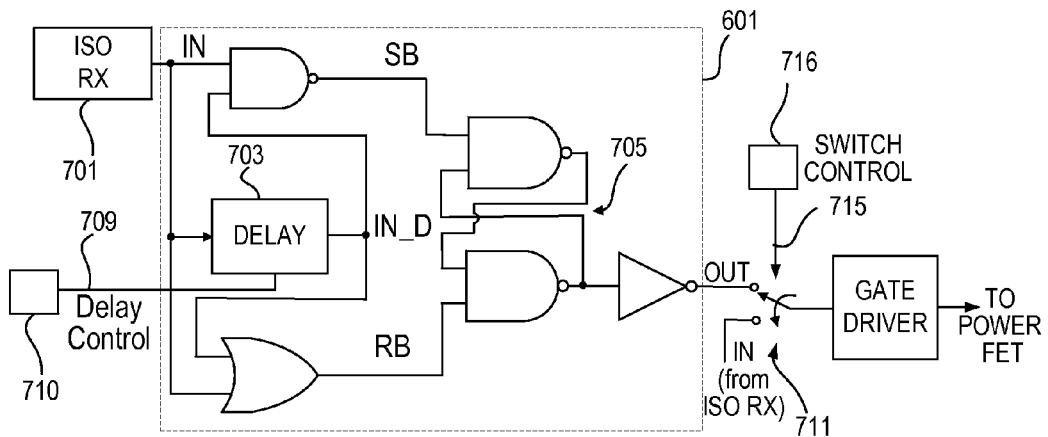
FIG. 7 illustrates an exemplary embodiment of a transient suppression circuit.
Figure 8:
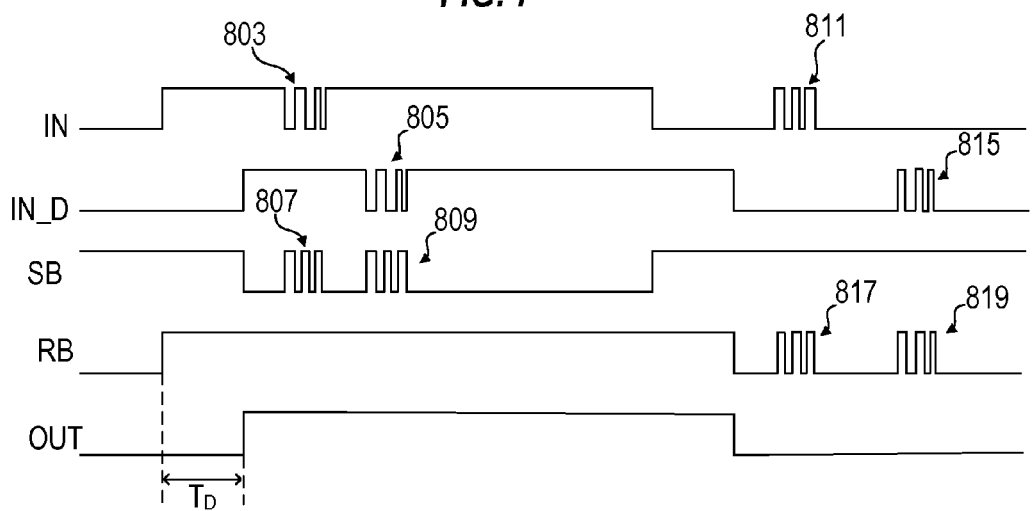
FIG. 8 illustrates operation of the transient suppression circuit of FIG. 7 in the presence of transients.

FIG. 7 illustrates an exemplary embodiment of the transient suppression circuit 601 that may be used in the system of FIG. 6. While a particular embodiment is illustrated in FIG. 7, other transient suppression circuits may be utilized in various embodiments described herein. The isolation receiver 701 receives a signal transmitted across the isolation barrier. In a preferred embodiment the isolation receiver 701 and the transient suppression circuit 601 are formed on the same integrated circuit die. The isolation barrier may be implemented as an opto-isolator, using transformers, using capacitive isolation, or with high voltage transistors. Referring to FIG. 8, the timing diagram illustrates operation of the transient suppression circuit. The transient suppression circuit 601 removes all transients that have an event duration that is less than delay of $T_D$, which correspond to the delay of delay block 703. Thus, the suppression circuit can be tailored for the desired event length by adjusting the length of the delay block 703. In some embodiments, the length of the delay block may be programmable. Thus, a delay control signal 709 from block 710, which may be an input terminal, non-volatile memory, or some other location, may determine the length of the delay by, e.g., controlling a number of delay elements in the delay block. That allows the isolation technology to be used in systems where different delays are desired. In addition a programmable system may be useful to allow determination, e.g., during characterization or production testing, of the minimum delay required to suppress common mode transients for a given system. In other embodiments the delay may be fixed.

Referring to FIGS. 7 and 8, the IN signal from the receive circuit 701 has transients 803. The transients show up in the delayed IN_D signal at 805 but not the RB signal, which ORs together the output IN_D of the delay block and the IN signal from the receive circuit 701. Both the original transients and the delayed transients show up in the SB signal at 807 and 809. Finally, the output of the gate driver OUT following the cross coupled NAND gates 705 is seen to be free of transients. Thus, the transients causing the normally high signal to be low at 803 have been suppressed. Positively going transients are shown at 811. The transients 811 show up in the delay block output at 815 and in the output of RB at 817 and 819. The transients do not show up at the output SB. Again, the output signal OUT to the gate driver following the cross coupled NAND gates 705 is seen to be free of transients. While a latching circuit using cross coupled NAND gates is shown in the illustrated embodiment, any type of SR latch or even a flip-flop based circuit may be utilized in other embodiments. The length of the delay block 703 has to be sufficient to guarantee that desired transients events below a particular length are suppressed.

The selected delay can be based in part on the desired CMTI. For example, assume a 0V to 600V working voltage. A CMTI of 30 kV/μs at 600V corresponds to a delay of 20 ns calculated based on $$\left(\left(\frac{30 \text{ kV}}{\mu s}\right)\Delta t = 600 \text{ V}\right),$$

where Δt corresponds to the delay of delay block 703. For a higher CMTI, the delay can be shorter. In one embodiment the delay is selected to ensure a CMTI of at least 30 kV/μs. Other embodiments may select a CMTI of 200 kV/μs. Note that the calculations shown herein are simplified for illustration. For example, there may be a ringing response so a real system may choose a delay of 30 ns rather than the 20 ns shown above. In addition, in actual systems the choice of delay is typically based on the maximum possible length of a CMTI failure that will be experienced due to its inherent CMTI immunity. The delay should always be that long rather than just being based solely on a target CMTI rate. For example, for a system that targets 200 kV/μs CMTI, Δt would be 3 ns. However, the inherent CMTI immunity of the isolation channel may be, e.g., 50 kV/μs. That means that the minimum CMTI for which the native channel will fail is 50 kV/μs, which corresponds to a pulse width of 12 ns, which is longer than 3 ns. So in order to determine the appropriate delay, native channel immunity also needs to be considered.

One aspect of the use of the transient suppression circuit is that propagation delay across the isolation technology is increased by the delay associated with the delay circuit plus delay of the other logic gates in the transient suppression circuit. For opto-isolator applications with propagation delays of, e.g., 100-200 ns, an extra 20 ns delay associated the suppression circuit would cause an approximate 10 to 20 percent increase in the propagation delay. Some applications using high voltage isolation can tolerate such additional propagation delays and other applications, e.g., digital communication across isolation barriers, where propagation delays may be on the order of 10 to 50 ns, may not be able to tolerate such application delays.

Referring to FIG. 7, for those applications that cannot tolerate the additional propagation delay, the use of the transient suppression circuit may be bypassed in some embodiments. Thus, for those applications that cannot tolerate the additional propagation delay, an embodiment may provide that the transient suppression circuit may be bypassed by selecting the bypass path through switch 711. The switch control signal 715, sourced from block 716, which may be an input terminal, non-volatile memory, or some other location, may be used to control the bypass function. Other embodiments may omit the suppression bypass logic entirely.

Figure 9:
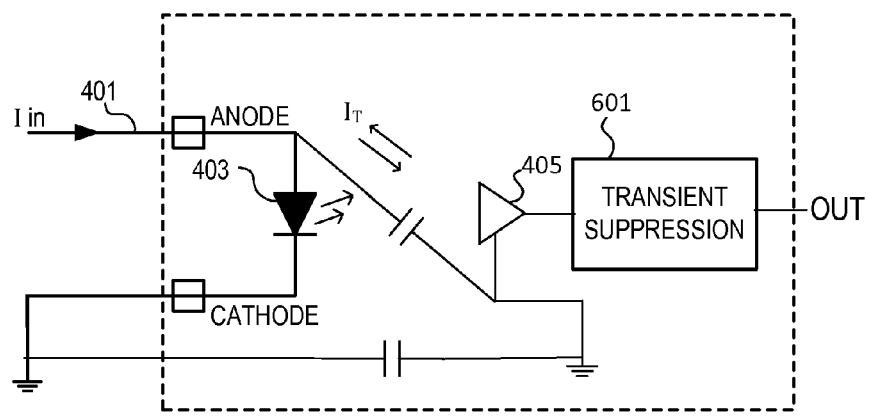
FIG. 9 illustrates an opto-isolator with a transient suppression circuit according to an embodiment.

Referring to FIG. 9, illustrated is an embodiment of an improved opto-isolator with a transient suppression circuit 601. The transient suppression circuit 901 may be implemented as illustrated in FIG. 7. Rather than use an opto-isolator with an LED, an alternative implementation with similar IV characteristics to the opto-isolator can be used in place of the opto-isolator illustrated in FIG. 9. In the embodiment illustrated in FIG. 10, the isolation link is implemented by providing two dies 1001 and 1003 between which is a communication link 1005. Each die 1001 and 1003 includes a transformer 1006 and 1008, respectively. Die 1001 includes transmit circuitry 1011 coupled to transformer 1006 and die 1003 includes receive circuitry 1015 coupled to transformer 1008. The signals are transmitted between the dies utilizing the transformers 1006 and 1008 in each die and the magnetic coupling effect between the transformers. In particular, transmit circuitry 1011 drives the transformer 1006 with a signal such that energy is coupled from the primary to the secondary thereof. That allows energy to be transmitted on transmission lines 1005 that couple the transformers 1006 and 1008 together. Each of the transformers is comprised of a primary 1027 and a secondary 1029. Isolation barriers are present between the primary and secondary windings of each transformer. The I/O terminals 1017 and 1019 correspond to the terminals of an opto-isolator. The input terminal 1017 may receive a current to indicate when to transmit across the isolation barrier and terminal 1019 may be a ground connection. Other transformer embodiments may use a single transformer rather than the two transformers illustrated in FIG. 9. The transient suppression circuit 1030, which may be implemented as illustrated in FIG. 7, suppresses transient events having a length less than a preselected event length.

Figure 10:
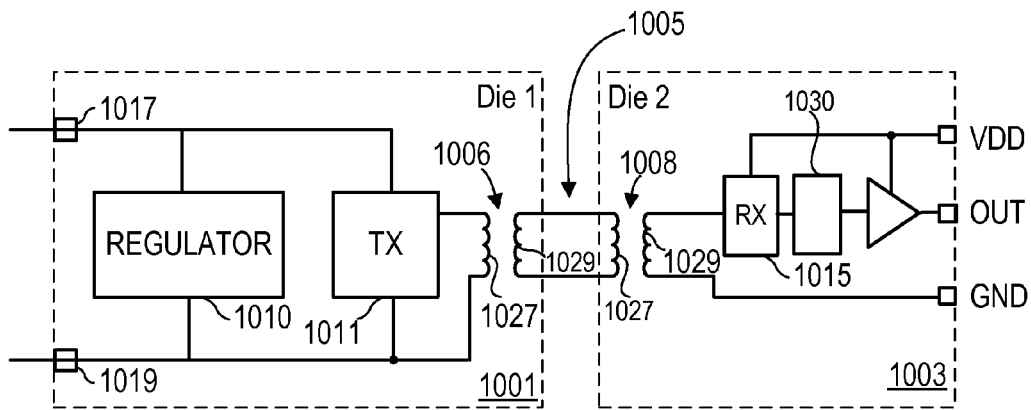
FIG. 10 illustrates a transformer based isolation system that may be used in place of the opto-isolator with a transient suppression circuit according to an embodiment.
Figure 11:
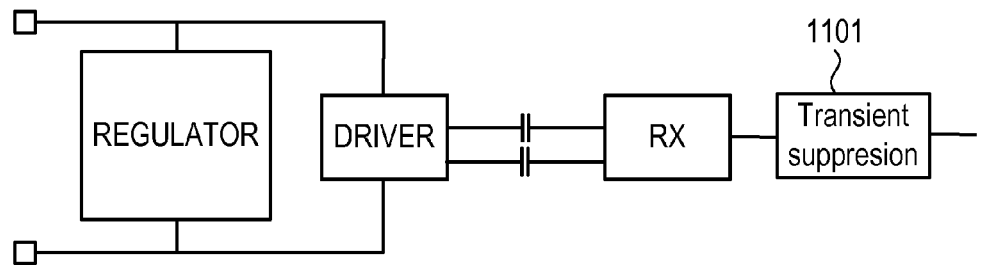
FIG. 11 illustrates a capacitive based isolation system that may be used in place of the opto-isolator with a transient suppression circuit according to an embodiment.
Figure 12:
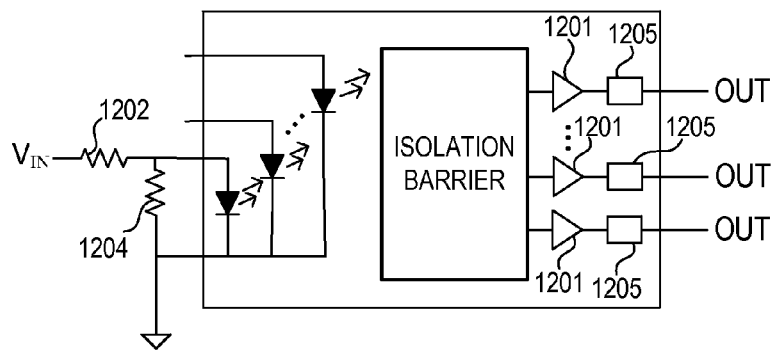
FIG. 12 illustrates a Programmable Logic Controller with transient suppression circuits according to an embodiment.

Rather than using transformer based isolation technology, FIG. 11 illustrates use of the transient suppression circuit 1101 in a capacitive coupled isolation barrier. The transient suppression circuit 1101 may be implemented as illustrated in FIG. 7. FIG. 12 illustrates an isolation technology in a Programmable Logic Controller (PLC) that has multiple inputs and multiple diodes, which may be used in industrial environments. The level of the voltage $V_{IN}$ that causes the diode to turn on can be programmed with external resistors 1202 and 1204. For ease of illustrations, additional external resistors are not shown for the other diodes. Rather than use diodes, an alternative isolation technology such as shown in FIG. 10 or 11 may be used. The receive circuits 1201 on the receive side of the isolation barrier, whether the communication channel across the barrier is opto, inductive, or capacitive, supply the received signals to transient suppression circuits 1205, which may be implemented in the manner illustrated in FIG. 7.

Thus, various approaches have been described relating to suppression of transients associated with communication across an isolation barrier. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. An apparatus comprising:
   an isolation barrier providing electrical isolation between a first domain including a transmit circuit and a second domain including a receive circuit;
   the receive circuit to receive a signal transmitted across the isolation barrier by the transmit circuit and to provide a receive circuit output signal; and
   a common mode transient suppression circuit coupled to the receive circuit to suppress transients in the receive circuit output signal that are present in the received signal but not in the signal transmitted;
   wherein the common mode transient suppression circuit includes a delay circuit; and
   wherein the common mode transient suppression circuit suppresses transients in the receive circuit output signal having an event length below a predetermined length of time, the predetermined length of time corresponding to a delay associated with the delay circuit.

2. The apparatus as recited in claim 1 wherein the receive circuit comprises a circuit to receive signals transmitted from a light emitting diode of the transmitter.

3. The apparatus as recited in claim 1 wherein the isolation barrier utilizes capacitive isolation.

4. The apparatus as recited in claim 1 wherein the isolation barrier includes a transformer.

5. The apparatus as recited in claim 1 wherein the predetermined length of time is less than approximately 50 nanoseconds.

6. The apparatus as recited in claim 1 wherein the predetermined length of time is less than approximately 30 nanoseconds.

7. The apparatus as recited in claim 1 wherein the apparatus has a common mode transient immunity of at least 200 kV/microsecond.

8. The apparatus as recited in claim 1 wherein the common mode transient suppression circuit further comprises:
   a first logic gate coupled to receive an input of the common mode transient suppression circuit and is coupled to receive an output of the delay circuit;
   a second logic gate coupled to receive the input of the common mode transient suppression circuit and is coupled to receive the output of the delay circuit; and
   a latching circuit coupled to the first and second logic gates.

9. A method comprising;
   transmitting a signal from a transmitter across an isolation barrier;
   receiving the signal at a receiver that is electrically isolated by the isolation barrier from the transmitter; and
   suppressing transients in the received signal having an event length less than a predetermined length of time, the suppressing including delaying the received signal in a delay circuit having a delay corresponding to the predetermined length of time.

10. The method as recited in claim 9 further comprising using a photodiode to transmit the signal to communicate across the isolation barrier.

11. The method as recited in claim 9 further comprises using capacitors to communicate across the isolation barrier.

12. The method as recited in claim 9 further comprising using transformers to communicate across the isolation barrier.

13. An isolation apparatus comprising:
   an isolation barrier providing electrical isolation between a transmit side and receive side;
   a transmit circuit disposed on the transmit side of the isolation barrier to receive an input signal and to transmit a signal across the isolation barrier to a receive circuit disposed on the receive side of the isolation barrier;
   the receive circuit to receive the transmitted signal on the receive side of the isolation barrier; and
   a common mode transient suppression circuit coupled to the receive circuit to suppress transients in the transmitted signal received by the receive circuit if the transients have an event length less than a predetermined amount of time, the common mode transient suppression circuit including a delay circuit having a delay corresponding to the predetermined amount of time.

14. The apparatus as recited in claim 13 wherein the delay of the common mode transient suppression circuit is programmable.

15. The apparatus as recited in claim 1 wherein the delay is programmable.

16. The apparatus as recited in claim 1 further comprising a switch providing a bypass path to bypass the the common mode transient suppression circuit according to a control signal.

17. The apparatus as recited in claim 13 further comprising a switch providing a bypass path to bypass the the common mode transient suppression circuit according to a bypass control signal.

18. The apparatus as recited in claim 16 further comprising a non-volatile memory storing the bypass control signal to selectively provide the bypass path according to a value of the bypass control signal.

19. The apparatus as recited in claim 16 further comprising an input terminal supplying the bypass control signal to selectively provide the bypass path according to a value of the bypass control signal.

* * * * *

UNITED STATES PATENT AND TRADEMARK OFFICE
CERTIFICATE OF CORRECTION

PATENT NO.         : 9,257,836 B2                           Page 1 of 1
APPLICATION NO.    : 14/143504
DATED              : February 9, 2016
INVENTOR(S)        : Michael J. Mills et al.

It is certified that error appears in the above-identified patent and that said Letters Patent is hereby corrected as shown below:

In the Claims

Column 8, line 25, In claim 16, line two, please replace "the the" with --the--;

Column 8, line 29, In claim 17, line two, please replace "the the" with --the--.

Signed and Sealed this
Third Day of May, 2016

Michelle K. Lee
*Director of the United States Patent and Trademark Office*

UNITED STATES PATENT AND TRADEMARK OFFICE
CERTIFICATE OF CORRECTION

PATENT NO. : 9,257,836 B2  
APPLICATION NO. : 14/143504  
DATED : February 9, 2016  
INVENTOR(S) : Michael J. Mills et al.

Page 1 of 1

It is certified that error appears in the above-identified patent and that said Letters Patent is hereby corrected as shown below:

In the Claims

Column 8, line 26, In claim 16, line two, please replace "the the" with --the--;

Column 8, line 30, In claim 17, line two, please replace "the the" with --the--.

This certificate supersedes the Certificate of Correction issued May 3, 2016.

Signed and Sealed this  
Thirty-first Day of May, 2016

Michelle K. Lee  
*Director of the United States Patent and Trademark Office*